United States Patent
Okabe

(10) Patent No.: US 6,852,619 B2
(45) Date of Patent: Feb. 8, 2005

(54) DUAL DAMASCENE SEMICONDUCTOR DEVICES

(75) Inventor: Ichiro Okabe, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/158,011

(22) Filed: May 31, 2002

(65) Prior Publication Data

US 2003/0227090 A1 Dec. 11, 2003

(51) Int. Cl.[7] .......................................... H01L 21/4763
(52) U.S. Cl. ..................... 438/637; 438/597; 438/618; 438/622; 438/624
(58) Field of Search ................................ 438/597, 618, 438/622, 624, 637

(56) References Cited

U.S. PATENT DOCUMENTS

| | | | |
|---|---|---|---|
| 5,989,997 A | * 11/1999 | Lin et al. ..................... | 438/622 |
| 6,187,666 B1 | * 2/2001 | Singh et al. ................. | 438/633 |
| 6,362,093 B1 | * 3/2002 | Jang et al. ................... | 438/633 |
| 6,406,995 B1 | * 6/2002 | Hussein et al. .............. | 438/638 |
| 2003/0054629 A1 | * 3/2003 | Kawai et al. ................ | 438/622 |

FOREIGN PATENT DOCUMENTS

| | | |
|---|---|---|
| JP | 10-223755 A | 8/1998 |
| JP | 2000-188329 A | 7/2000 |

* cited by examiner

*Primary Examiner*—Tom Thomas
*Assistant Examiner*—N. Drew Richards
(74) *Attorney, Agent, or Firm*—Birch, Stewart, Kolasch & Birch, LLP

(57) ABSTRACT

A semiconductor device has a wiring slot and two wiring layers connected by a via hole. The semiconductor device is formed using a photodegradable polymer film that degrades under UV radiation. An incidence angle θ of radiation rays in the irradiating step with respect to a perpendicular direction of a surface of the substrate, fulfills the relationship tan $\theta \geq H+H'/2(D+D')$ wherein D is a depth of the wiring slot, D' is a thickness of the photoresist film, H is a diameter of the via hole in a opening of the wiring slot, and H' is the width of the wiring slot.

17 Claims, 6 Drawing Sheets

DUAL DAMASCENE SEMICONDUCTOR DEVICES

FIELD OF THE INVENTION

This invention is directed semiconductors having wiring components with dual damascene structures in the upper part of a first wiring layer.

BACKGROUND OF INVENTION

With each succeeding generation, semiconductor integrated circuits increase in speed and their features proliferate. Two factors govern the speed of signal transmission in semiconductor circuits: 1) switching time (gate delay component) in the transistor portion, and 2) the time that an electrical signal is propagated in a circuit (wiring delay component). The gate delay component tends to decrease with the reduction of transistor size, while the wiring delay component tends to increase with the refinement, i.e., diminuation, in size of wiring layers and the increasing complexity of wiring circuitry. Since wiring delay is determined by the product (C×R) of wiring capacity C and wiring resistance R, the use of Cu as a material for wiring has been enthusiastically studied as a means of restricting wiring delay since it has a lower resistance than Al which has traditionally been used.

Damascene refers to a process in which interconnect metal lines are delineated by isolating dielectrics. Damascening is not performed by lithograpy and etching, but by chemical-mechanical planarization (CMP). In damascening, an interconnect pattern is first lithographically defined in the layer of dielectric, then metal is deposited to fill in the resulting trenches. Then excess metal is removed by means of chemical-mechanical polishing (planarization).

Chemical-mechanical polishing (CMP), also called chemical-mechanical planarization, refers to a method of removing layers of solid by chemical-mechanical polishing carried out for the purpose of surface planarization and definition of the metal interconnect pattern.

Dual damascene is a modified version of the damascene process which is used to form metal interconnect geometry using a CMP process instead of metal etching. In dual damascene, two interlayer dielectric patterning steps and one CMP step create a pattern which would otherwise require two patterning steps and two metal CMP steps when using a conventional damascene process.

FIGS. 1(a) through 1(d) are drawings explaining a conventional method of manufacturing a semiconductor device having dual damascene structure wiring.

In a first conventional method of manufacturing, a first silicon nitride ($Si_3N_4$) film 3, a first silicon oxide film 4, a second silicon nitride ($Si_3N_4$) film 5 and a second silicon oxide film 6 are successively formed over a layer insulation film 2 in which a first wiring layer 1 is embedded. This is shown in FIG. 1(a). The first wiring layers are formed on a substrate, not depicted in the drawings for the sake of brevity.

Next, anisotropic dry etching to open via hole 8 is performed using a first photoresist 7 as a mask. This etching is performed until the first nitride film 3 is exposed in the interior of via hole 8. The first nitride film 3 acts as a stopper film that stops the progress of etching in this etching process as shown in FIG. 1(b).

When the etching to open via hole 8 is finished, the first photoresist 7 is removed from above the second silicon oxide film 6, and a second photoresist 9 which has an open portion that corresponds to the wiring slot 10 is formed in its place, as shown in FIG. 1(c).

Next, anisotropic dry etching to open wiring slot 10 is performed using the second photoresist 9 as a mask. This etching is performed under the condition that a silicon oxide film can be removed with a significant selection ratio to the silicon nitride film. At this time, the first silicon nitride film 3 and the second nitride film 5 are both used as stopper films which stop the progress of etching. Next, etching for the purpose of removing the second silicon nitride film 5 exposed in the bottom of wiring slot 10 and the first silicon nitride film 3 exposed in the bottom of via hole 8 is performed. If this processing is done properly, via hole 8 which exposes the surface of first wiring layer 1 and wiring slot 10 which leads to via hole 8 are formed as shown in FIG. 1(d).

However, with respect to the first silicon nitride film 3, in the etching process to form wiring slot 10, the bottom portion of via hole 8 is exposed to etchant gas (hereafter that portion will be referred to as the "exposed portion"). Likewise, that exposed portion is substantially etched in the etching process to open the wiring slot 10 due to variation in the manufacturing conditions. Under these circumstances, during the etching process to open the wiring slot 10, via hole 8 goes through the first silicon nitride film 3 and the surface of the first wiring layer 1 may be exposed. Such being the case, damage to the first wiring layer 1 occurs due to continued subsequent etching as shown in FIG. 2, and the resistance value may increase as a result.

In an effort to solve these problems in this conventional dual damascene method, it has been proposed to fill the previously noted via hole 8 with a polymer such as a photoresist during the process of forming wiring slot 10, thereby protecting the first wiring layer 1. FIGS. 3(a) through 3(d) illustrate a method of forming a dual damascene structure with this previously proposed method. In FIGS. 3(a) through 3(d), the same reference numbers have been used as in the previous explanation and therefore will not be explained.

A polymer film 11 (See FIG. 3(b)) is formed so that the via hole 8 will be embedded in the silicon nitride film at the time the structure of FIG. 3(a) is formed. In the process of FIG. 3(c), the residual polymer film on the silicon oxide film is eliminated by etching back. Next, in FIG. 3(d) a second resist pattern having an open portion in the place corresponding to wiring slot 10 is formed by such techniques as photolithography and electron beam lithography. Using this as a mask, previously noted wiring slot 10 is formed by etching back. In this process, polymer film 11 restricts the damage that the first wiring layer 1 will sustain from the etching process.

When using this previously noted process, it is difficult to control the depth of polymer film 11 in the etching back process of FIG. 3(c). When this etching back process is conducted in oxygen plasma, the etching speed becomes very fast due to the etching speed planar distribution being non-uniform. Further, when etching with oxygen plasma in this way, the polymer that adheres to the walls of the reaction chamber of the dry etching device peels off due to exposure to the oxygen plasma. This detritus becomes particles which adhere to the semiconductor or device substrate, thereby causing contamination problems such as the formation of defects. While problems like these may be at least partially avoided by performing the etch back process of FIG. 3(c) in a special dry etching device, the manufacturing process for semiconductors thereby becomes highly complex and thus increases manufacturing costs.

As an alternative to the method which peels off the polymer layer using the etching back method, a method which replaces the previously noted polymer film 11 with a photosensitive resin which can be dissolved by alkali was proposed in Japanese Unexamined Patent Application 2000-188329. In this technique, after the process of applying the polymer film of FIG. 3(b), the entire wafer surface is subjected to a light of a set wavelength, and the light sensitive portion is removed by an alkali aqueous solution. However, defects tend to occur and, as before, there were problems with reliability of the process for removing the polymer layer with an alkali aqueous solution. In addition, with the polymer removal process it is necessary to use a special high precision developing device, which further increases manufacturing costs.

Besides the two previously noted methods, as in Japanese Unexamined Patent Application 10-223755, there is a method of forming a resist pattern by applying a polymer film 11 such as an organic reflection preventing film without performing an etch back process. This simplifies the process, but the polymer film adhering to the side walls of the via hole becomes a mask when etching the layer insulation film around the via hole, and a layer insulation film residue 12 which has a fence configuration around the via hole occurs. Such a layer of photoresist film residues with a fence configuration causes variations in the resistance value of the wiring layer.

As has been shown, conventional semiconductor processing forms fence structures around the via hole, and disadvantageous resistance variations in the wiring layer result. Further, conventional semiconductor processing causes contamination problems and the associated proliferation of defects.

SUMMARY OF THE INVENTION

The invention, in part, restricts the variation of the resistance of the wiring layer and inexpensively obtains a manufacturing process that will not damage the underlying wiring layer. The invention, in part, is directed to a semiconductor device such as a thin film transistor (TFT) and a method of manufacturing semiconductor devices which have a laminated second wiring layer on a connecting hole after forming the connecting or via hole above a first wiring layer.

The method of the invention, in part, includes providing a layer insulation film having an embedded first wiring layer over a substrate, depositing an etching stopper film over the first wiring layer, depositing a between layer insulation film, and using a photoresist pattern as a mask for forming connecting holes, and forming holes for the connecting holes by etching the layer insulation film. The method, in part, further includes forming a photodegradable polymer layer on the via hole and the entire surface of the layer insulation film. Thereafter, a photoresist pattern is transferred to form a second wiring layer on the polymer film. Then, the second wiring layer is irradiated after transferring the resist patterns. Next, a slot for the second wiring layer is formed by etching the previously noted between layer insulation film using the photoresist pattern as a mask. The photoresist resist pattern for the second wiring layer and the photodegradable polymer film is then removed, as is the connecting hole stopper film. Finally, the connecting hole and second wiring layer are formed by embedding a barrier metal and metallic film in the hole for the connecting hole and in the slot for a second wiring layer.

The method of the invention, in part, sufficiently increases the etching speed of the polymer film adhering to the side walls of the via hole so that the generation of a fence around the via hole can be prevented. In addition, the device obtained by the radiation processing is less expensive than the conventional method of etching back and is superior to the process to remove polymers with solvents. Moreover this process generates smaller amounts of exhaust gases and liquids. Likewise, the radiation device can be placed in such things as existing etching device load-lock chambers etc. and does not call for an increase in floor space.

In addition, the invention, in part, pertains to the thickness, c, of the polymer film deposited in the bottom of the connecting hole being preferably c=6×b (nm) or greater, assuming the thickness of the polymer film adhering to the walls of the connecting hole to be "b" in the process of forming the photodegradable polymer film. If this condition is fulfilled, then the polymer film will sufficiently fulfill the role of a protective layer for the first wiring layer and the generation of a fence around the via holes can be restricted.

In addition, it is desirable to use a light source with a wavelength area of 180 nm or less in the radiation process. By adopting this method, the process of only dissolving polymer chains of photodegradable polymers can be selectively applied, and it becomes possible to restrict the process of polymer chain polymerization which occurs as a side reaction. Above all, it is desirable that the volume of oxygen e [mol/l] existing in the processing atmosphere in the radiation processing is such that the product of e and f is $1 \times 10^{-6}$ [mol·m/l] or less if the distance between the processing substrate and the light source is f[m]. If this condition is fulfilled, the time necessary for radiation processing can be shortened, and the reduction of thickness of photoresist pattern film in the radiation process can be prevented.

The invention, in part, preferably has an incidence angle θ of radiation rays in the radiation processing with respect to the perpendicular direction of the first wiring layer substrate surface, and fulfills the relationship indicated by equation (1), wherein the depth of the previously noted slot for wiring is D, the thickness of the film of the resist pattern is D', the diameter of the connecting hole in the opening of the wiring slot is H and the width of the wiring slot is H'.

$$\tan \theta \geq H + H'/2(D+D') \tag{1}$$

By fulfilling this relationship, one can selectively increase the etching rate of the polymer film adhering to the side walls of the connecting holes and an increase in the etching rate of the polymer film deposited in the bottom of the connecting holes can be prevented.

BRIEF DESCRIPTION OF THE DRAWINGS

The accompanying drawings are included to provide a further understanding of the invention. The drawings illustrate embodiments of the invention and together with the description serve to explain the principles of the embodiments of the invention. A preferred embodiment of this invention will be described below with reference to drawings. In the drawings the same symbols are used to refer to the same items, thereby avoiding redundant explanations.

FIGS. 6(a)–6(h) define symbols for relationships used in embodiments 1 through 5 of the present invention.

DETAILED DESCRIPTION OF THE PREFERRED EMBODIMENTS

Figure 1A:
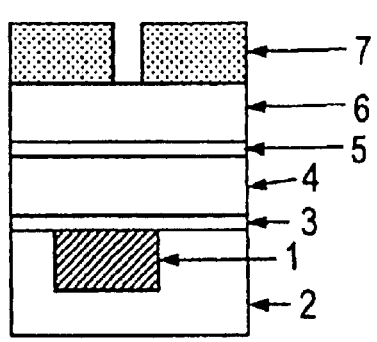
FIGS. 1(a)–1(d) illustrate a first cross-sectional drawing for explaining a conventional method of manufacturing a semiconductor device having dual damascene structure wiring.
Figure 1B:
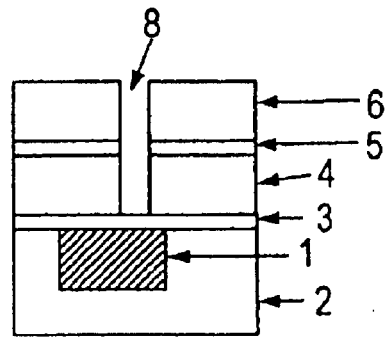
Figure 1C:
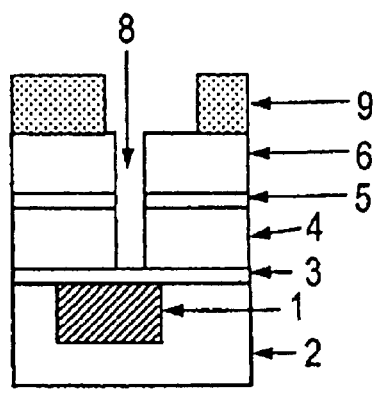
Figure 1D:
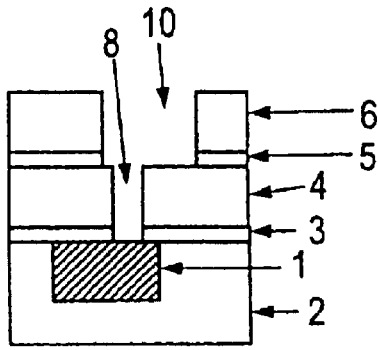
Figure 2:
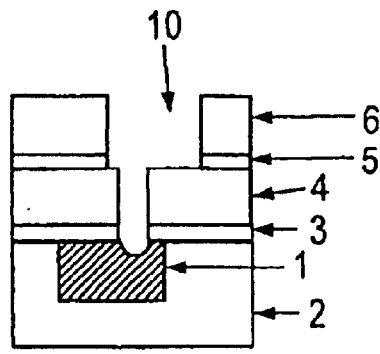
FIG. 2 illustrates problems in the known dual damascene method.
Figure 3A:
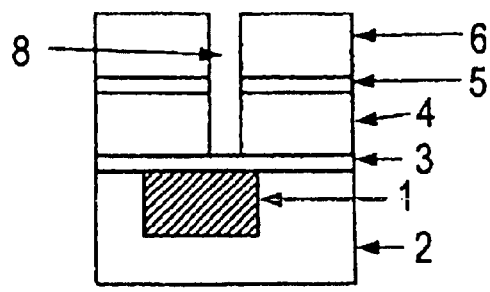
FIGS. 3(a)–3(d) illustrate a second cross-sectional drawing for explaining a conventional method of manufacturing a semiconductor device having dual damascene structure wiring.
Figure 3B:
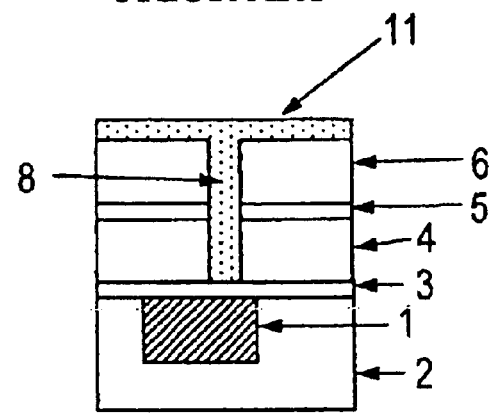
Figure 3C:
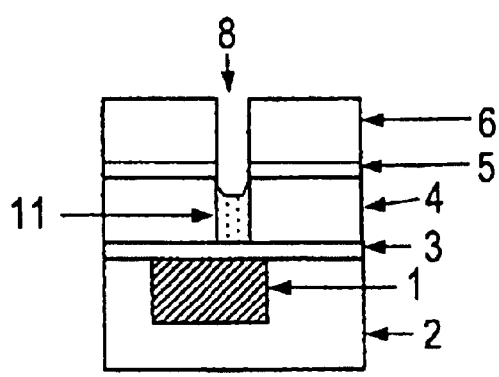
Figure 3D:
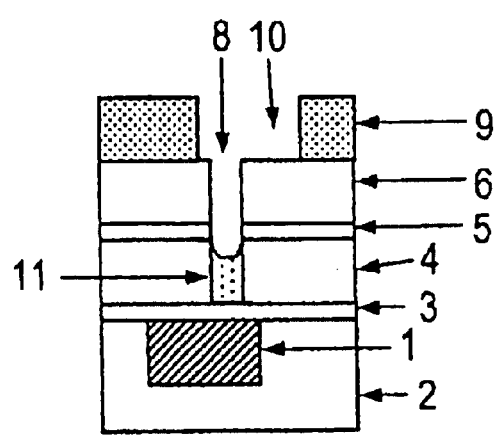
Figure 5A:
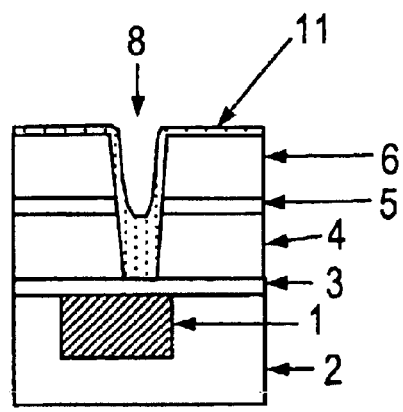
FIGS. 5(a)–5(d) illustrate continuous processing executed in the methods of manufacturing semiconductor devices in embodiments 1 through 4 of the present invention.
Figure 5B:
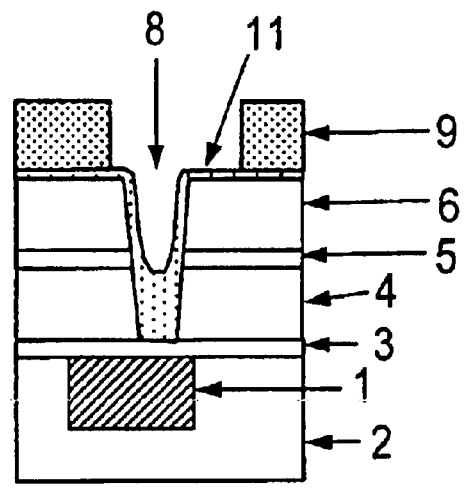
Figure 5C:
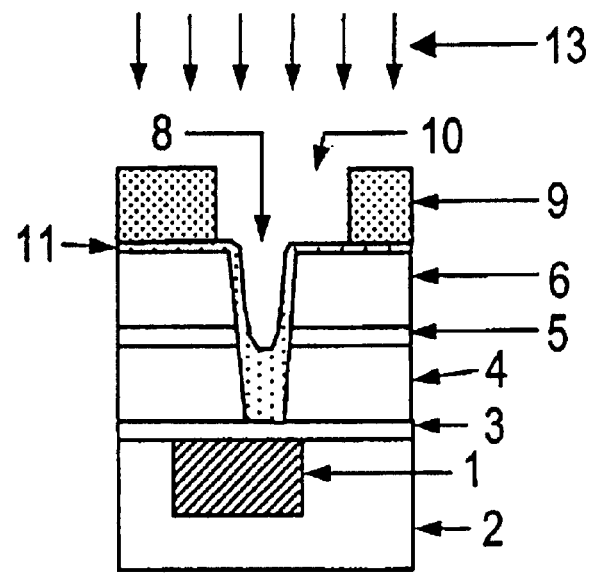
Figure 5D:
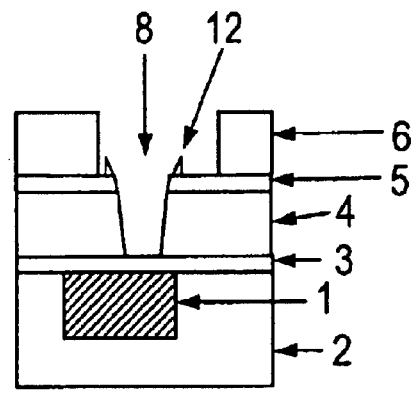

Advantages of the present invention will become more apparent from the detailed description given herein after. However, it should be understood that the detailed description and specific examples, while indicating preferred embodiments of the invention, are given by way of illustration only, since various changes and modifications within the spirit and scope of the invention will become apparent to those skilled in the art from this detailed description.

A first preferred embodiment of this invention including application 1, and comparative examples 1 and 2 are explained with reference to FIG. 5. All layer thicknesses are exemplary and are not intended to restrict the scope of the invention.

In this embodiment, a plasma CVD device manufactured by ASM Japan K.K. was used. A first silicon nitride ($Si_3N_4$) film 3 is deposited to a thickness of about 40 nm over a layer insulation film 2 in which a first wiring layer 1 is embedded. The layer insulation film is over a substrate (not shown). A first silicon oxide film 4 is deposited over the first silicon nitride film 3 to a thickness of about 400 nm. Then, a second silicon nitride ($Si_3N_4$) film 5 is deposited at a thickness of about 50 nm for example, and a second silicon oxide film 6 is deposited at a thickness of about 400 nm. Next a 500 nm thick layer thickness first photoresist (not shown) is formed using, for example, a chemical amplification type photoresist DX™ 5200P made by Clariant Company and a KrF excimer laser exposure device, for example, a NSR-S203 made by Nikon.

DX™ 5200P is a chemical-amplification type deep-UV photoresist capable to 180 nm and below with an attenuated phase shift mask in production. However, any suitable chemical amplification photoresist can be used in the invention. A typical deep UV chemical amplification photoresist is a copolymer of N-vinyl lactam derivatives and styrenic or acrylate derivatives such is set forth in U.S. Pat. No. 6,262,222 to Kim et al.

The Nikon Corporation NSR S203 is a step and scan lithography tool (scanner). In the step and scan lithography tool, the illuminator produces a narrow slit, and by moving the reticle and the wafer simultaneously through this illumination slit, the reticle image is projected on the wafer.

Next, anisotropic dry etching to open via hole 8 is performed, using a dry etching device (A-IEM) made by Tokyo Electron Company using the first photoresist as a mask. The previously noted etching is preferably performed until the first silicon nitride film 3 is exposed in the interior of via hole 8. The diameter of the via hole after processing is preferably about 200 nm.

When the etching to open via hole 8 was completed, the first photoresist is then removed from above the second silicon oxide film 6, by oxygen ashing for example. Next, solutions containing the respective polymers shown in Table 1, for example, are spin applied to form polymer film 11.

Figure 6A:
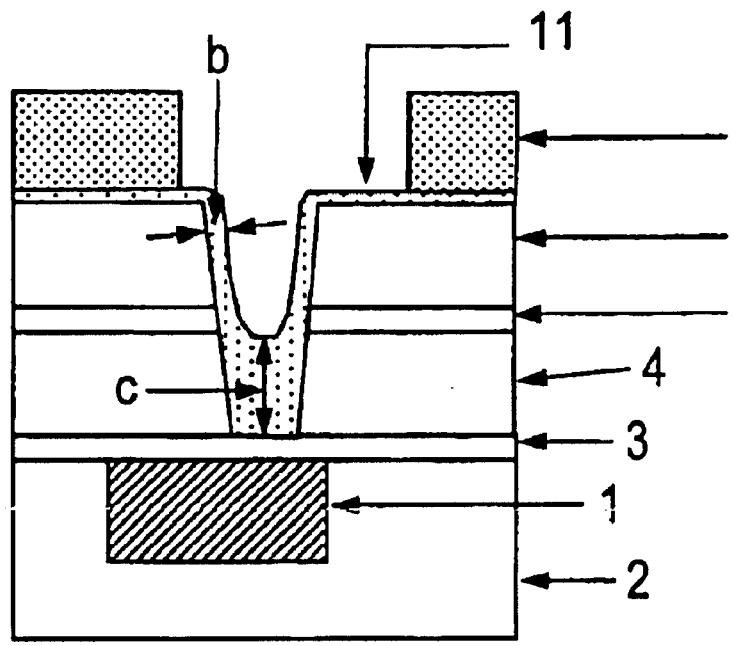
Figure 6B:
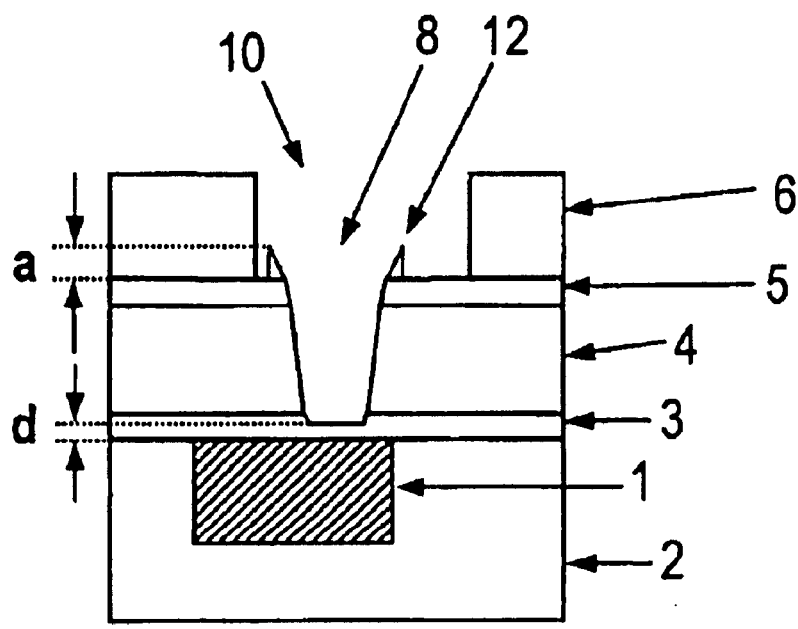
Figure 7A:
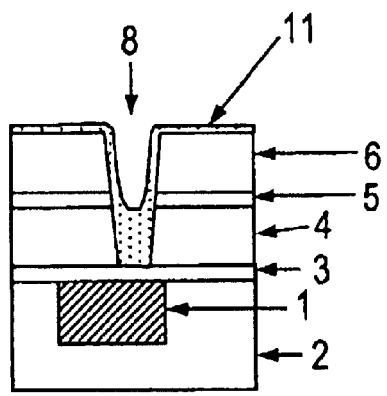
FIGS. 7(a)–7(d) illustrate continuous processing executed in the method of manufacturing semiconductor devices in embodiment 5 of the present invention.
Figure 7B:
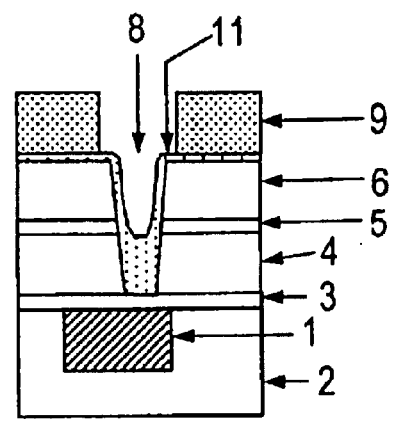
Figure 7C:
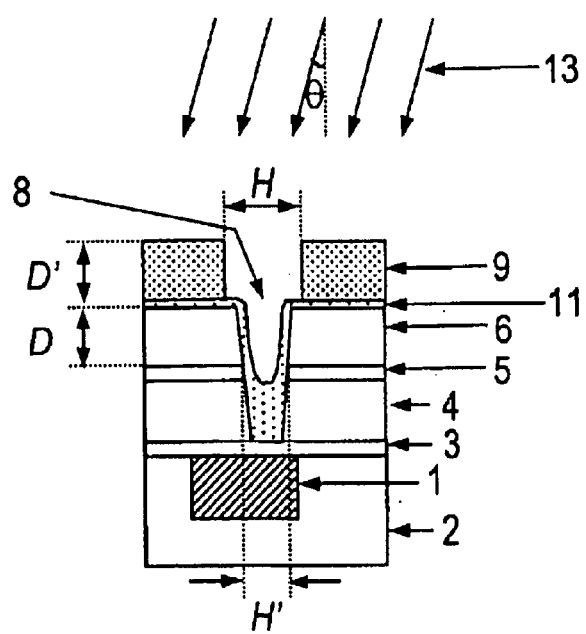
Figure 7D:
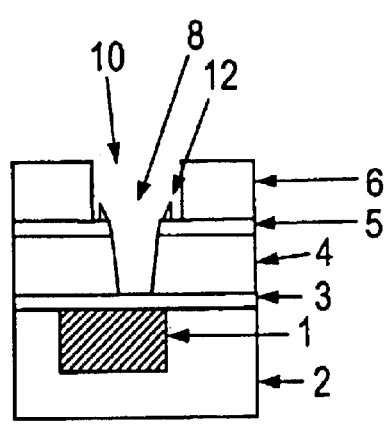

The thickness c of the polymer film 11 deposited in the bottom of the via hole 8 is preferably c=6×b (nm) or greater, assuming the thickness of the polymer film adhering to the walls of the via hole to be "b" in the process of forming the photodegradable polymer film (See FIG. 6). If this condition is fulfilled, then the polymer film will continue to sufficiently fulfill the role of a protective layer for the first wiring layer and the generation of a fence around the via holes can be restricted.

Next a second photoresist pattern 9 having an opening corresponding to the portion of the wiring slot is formed using a chemical amplification type photoresist DX™ 5400P (Deep UV photoresist) made by Clariant Company, for example. A KrF excimer laser exposure device (NSR-S203A made by Nikon for example), is then used to pattern the photoresist. After forming the photoresist patterns, as with the examples of application 1 and comparative example 1, an excimer lamp radiating device (made by Ushio Inc., for example) which can generate about 172 nm wavelength monochromatic light, irradiates the entire wafer with energy of about 200 (mJ/cm$^2$). On the other hand, as with comparative example 2, the irradiation process is dispensed with.

Next, anisotropic dry etching to open wiring slot 10 with the second photoresist 9 as a mask is performed, using a dry etching device made by Tokyo Electron (A-IEM), for example. In the previously noted etching, a gas preferably mixed at $C_4F_8$:$O_2$:Ar=30 sccm: 20 sccm 5 sccm is used, so that the silicon oxide film can be removed with a large selection ratio with respect to the silicon nitride film. Next, ashing processing, preferably with oxygen gas, is performed to remove the second photoresist 9 and polymer film 11 remaining on silicon oxide film 6 and the bottom of the via hole 8.

Thereafter, the connecting hole and second wiring layer are formed by embedding a barrier metal and metallic film in the hole for the connecting hole and in the slot for a second wiring layer.

The results of comparing the height of fence 12 for the respective examples of application and comparative examples are shown. It is clear from the results that in the first example of application in which a photodegradative polymer (polymethylmethacrylate, PMMA) under the second photoresist layer 9, that after forming a second photoresist pattern, no fence 12 was generated in the first example of application which includes a radiation process.

TABLE 1

|  | Type of Polymer Film 11 | Radiation Processing | Height of Fence 12 a (nm) |
| --- | --- | --- | --- |
| Example of Application 1 | Polymethylmethacrylate (PMMA) photodegradable polymer | Yes | 0 |
| Comparative Example 1 | Polymethylacrylate (PMA) photocrosslinking polymer | Yes | 150 |
| Comparative Example 2 | Polymethylmethacrylate (PMMA) photodegradable polymer | No | 180 |

While an excimer lamp with a 172 nm wavelength is used in the radiation processing in this example of application, another method may be used if it is a radiation source that can cause a break in the main chain of polymer 11. For example, an electron beam, ArF excimer laser light, an $F_2$ excimer laser light or soft X-rays may be used.

Likewise, an amount of such materials as carbon or fluorine may be mixed in with the silicon oxide film 4 or 6. In addition, the nitrided silicon film 5 may also be dispensed with.

Although polymethylmethacrylate (PMMA) is used for the polymer film 11 in this example, any polymeric material or mixture that decomposes upon exposure to radiation can be used. These polymeric materials include polyisobutylene, poly-α-methylstyrene, polyacrylate, polymethacrylate, polymethacrylamide, polyvinylidene chloride, cellulose, cellulosic polymers, polytetrafluoroethylene, tetrafluoroethylene or generally vinylidene type monomer polymers and copolymers shown in Formula (1) may be used.

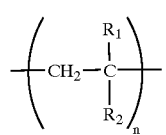

(1)

$R_1$ and $R_2$ in Formula (1) are each independently an alkyl group. $R_1$ and $R_2$ can be but are not restricted to substituted and unsubstituted methyl, ethyl, propyl, isopropyl, butyl, isobutyl, tert-butyl, pentyl, isopentyl, cyclopentyl, hexyl, cyclohexyl, heptyl, octyl, nonyl, decyl, undecyl, dodecyl, tridecyl, tetradecyl, pentadecyl, cetyl, and stearyl. $R_1$ and $R_2$ can also be a substituted or unsubstituted aromatic group.

In the following, variant examples in a second embodiment of this invention will be explained in comparison with examples of applications 2–4 with reference to FIG. 5 and FIG. 6.

FIG. 5 and FIG. 6 depict examples of applications 2–4 and variant examples 1–2. The examples of applications 2–4 second embodiment and variant examples 1–2 of the method of manufacturing semiconductors are basically the same as the first example of application of the first embodiment. However, the light source used in the radiation process is preferably now a soft X-ray with a wavelength of about 13 nm, for example, and the amount of energy radiated at the time of full exposure is about 300 (mJ/cm$^2$), for example. Polymethylmethacrylate is used for polymer film 11. With respect to the solution of polymer film 11 that is spin applied, the thickness "b" of polymer film built up on the walls of the via hole, and the thickness "c" of the polymer film deposited on the bottom of the via hole are preferably varied as per examples of application 2–4 and variant examples 1–2 by varying the viscosity and the amount of molecules. The viscosity can be reduced, for example, by diluting the polymer solution with an appropriate solvent.

The results are shown in Table 2. The height of fence 12 is measured after removal of the second photoresist 9 and polymer film 11, and no fence is generated in examples of application 2–4 and variant examples 1–2. However, in the examples of applications 2–4, there is a reduction in film thickness "d" of silicon nitride film 3, which is a stopper film. Decrease in the stopper film is not desirable since it may cause damage to the underlying wiring layer during the etching process.

From the above results, it can be determined that damage to silicon nitride film 3 in the etching process for the second wiring layer can be minimized when the thickness of polymers in the via hole wall is "b" if the amount of polymer deposition in the bottom of the via hole is set at about "6b" or greater.

In the examples of application set forth in Table 2, a 13 nm wavelength soft X-ray is used in the radiation process, but other methods may be used if they utilize a source of radiation which breaks the main chain of polymer film 11. For example, such radiation sources as electron beams, ArF excimer laser light sources, $F_2$ excimer laser light source, 172 nm excimer lamps, 222 nm wave length excimer lamps etc. may be used.

There are many variations possible in the process of the invention. For example, a minute amount of carbon and/or fluorine etc. may be mixed in silicon oxide film 4 and 6. Similarly, silicon nitride film 5 may be dispensed with.

In addition, while polymethylmethacrylate is preferably used for polymer film 11, any material which will decompose, i.e., break the main polymer chain, when exposed to radiation can be used. These polymeric materials include but are not restricted to polyisobutylene, poly-α-methylstyrene, polymethacrylate, polymethacrylamide, polyvinylidene chloride, cellulose, cellulosic derivatives, polytetrafluoroethylene, tetrafluoroethylene or generally vinylidene type monomer polymers or copolymers shown in the aforementioned Formula (1) can be used.

TABLE 2

| Example | Thickness b (nm) of polymer film 11 on the side wall of via hole | Amount of c (nm) of polymer deposited on bottom of via hole | c ÷ b | Height a (nm) of fence 12 | Residual film amount d (nm) of silicon nitride film 3 |
| --- | --- | --- | --- | --- | --- |
| Example of Application 2 | 35 | 100 | 2.86 | 0 | 5 |
| Example of Application 3 | 40 | 170 | 4.25 | 0 | 15 |
| Example of Application 4 | 45 | 220 | 4.89 | 0 | 32 |
| Variant Example 1 | 40 | 250 | 6.25 | 0 | 40 |
| Variant Example 2 | 45 | 310 | 6.89 | 0 | 40 |

In the following, examples of application of a third embodiment of the invention will be explained in comparison with variant examples 3–5 with reference to FIG. 5 and FIG. 6.

FIG. 5 and FIG. 6 are diagrams depicting examples of applications 5–11 and variant examples 3–5.

The examples of application and variant examples 5–11 of the method of manufacturing semiconductors of the second embodiment and the comparative examples 3–5 are the same as the first example of application of the first embodiment. However, an ArF excimer laser photoresist (PAR-722) made by Sumitomo Chemicals, for example, is used for the second photoresist and an ArF excimer laser light exposing device (MS193) made by SVGL Company, for example, is used for irradiating. The polymer films 11 used in examples of applications 5–11, comparative examples 3–5 and the light sources used in the radiation processing are shown in Table 3. Incidentally, TDUR-N909 made by Tokyo Oka Company (TOK) contains polymer crosslinking agents and is sold as a negative resist for KrF excimer lasers. Thus, there is a tendency for crosslinking between polymers to proceed with respect to radiation. The radiation processing in this embodiment is preferably carried out in a vacuum chamber.

The results are shown in Table 3. The height of fence 12 is measured after removal of the second photoresist 9 and polymer 11 and no fence is generated in examples of applications 5–11. However, a fence is generated in comparative examples 3–5. Then, when measuring the change in polymer volume of polymer film 11 before and after radiation with gel pepermeation chromatography (GPC), it is found that the polymer film is insoluble by the solvent used during GPC analysis when light having a wavelength of about 180 nm for example, or alternately an electron beam, was irradiated on a resist made by Tokyo Oka (TDUR-N909), for example. This shows that the polymer film macropolymerizes due to irradiation.

From the above results it can be determined that by using light having a wavelength less than about 180 nm in the irradiation process, polymer main chain breakage can be induced even in polymers which tend to cross-link, and we can expect that the range of selection of polymers that can be used for polymer film 11 will be broadened.

Likewise, such things as a minute amount of carbon and fluorine etc. may be mixed in silicon oxide film 4 and 6. Similarly, silicon nitride film 5 may be dispensed with.

In the following, variant examples 3–4 in a fourth embodiment of the invention will be explained in comparison with examples of applications 12–13 with reference to FIG. 5 and FIG. 6.

FIG. 5 and FIG. 6 are drawings for explaining examples of applications 12–13 and variant examples 3–4. The examples of applications 12–13 of the second embodiment and variants 3–4 of the method of manufacturing semiconductors are the same as the first example of the first embodiment. However, polymethacrylate is used as the polymer film 11 in examples 12–13 and variant examples 3–4. The light source used in the irradiation process is a plotting type $F_2$ excimer laser device manufactured by CYMER Company, for example, that can emit monochromatic light of about 157 nm.

Figure 8:
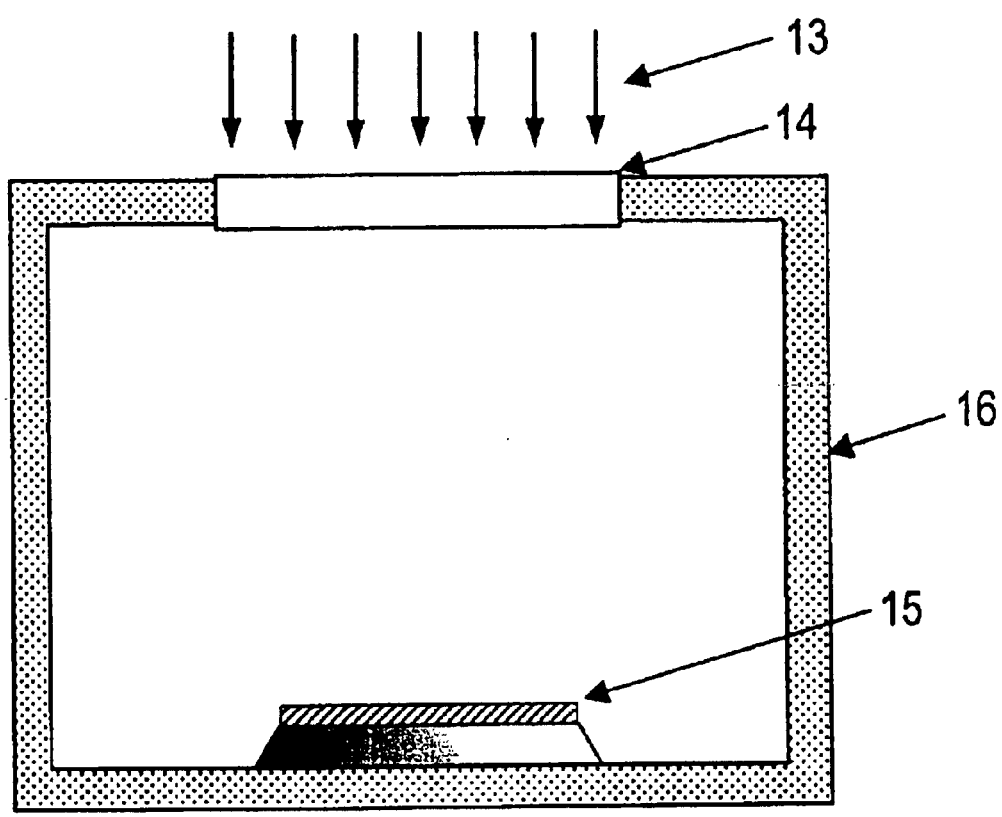
FIG. 8 illustrates the structure of the sealed vessel used in the methods of manufacturing semiconductor devices in embodiment 4 of the present invention.

The radiation process itself is preferably performed in a sealed vessel 16 like that shown in FIG. 8. The composition of the gases in the sealed vessel includes nitrogen and oxygen, and the vessel is designed so that the compositional proportions may be freely changed. Likewise, the distance from the window 14 allowing laser light 13 onto the surface of the substrate 15 is set at about 25 cm, for example. The

TABLE 3

| | Type of polymer 11 | Source of radiation | Change in amount of molecular weight due to irradiation of radiation | | Height of fence a (nm) |
| --- | --- | --- | --- | --- | --- |
| | | | Prior to radiation | After radiation | |
| Example of application 5 | TDUR-N909 (Manufactured by TOK) | $F_2$ excimer laser light (157 nm wavelength) | 4000 | 1200 | 0 |
| Example of application 6 | Polymethyl-methacrylate | $F_2$ excimer laser light (157 nm wavelength) | 4000 | 1000 | 0 |
| Example of application 7 | TDUR-N909 (Manufactured by TOK) | Excimer lamp (172 nm wavelength) | 4000 | 1310 | 0 |
| Example of application 8 | Polymethyl-methacrylate | Excimer lamp (172 nm wavelength) | 4000 | 1030 | 0 |
| Comparative example 3 | TDUR-N909 (Manufactured by TOK) | ArF excimer laser light (193 nm wavelength) | 4000 | Insoluble in GPC solvent (macromolecularized) | 140 |
| Example of application 9 | Polymethyl-methacrylate | ArF excimer laser light (193 nm wavelength) | 4000 | 1100 | 0 |
| Comparative Example 4 | TDUR-N909 (Manufactured by TOK) | Excimer lamp (222 nm wavelength) | 4000 | Insoluble in GPC solvent (macromolecularized) | 150 |
| Example of Application 10 | Polymethyl-methacrylate | Excimer lamp (222 nm wavelength) | 4000 | 1150 | 0 |
| Comparative Example 5 | TDUR-N909 (Manufactured by TOK) | Electron beam (10 keV) | 4000 | Insoluble in GPC solvent (macromolecularized) | 130 |
| Example of Application 11 | Polymethyl-methacrylate | Electron beam (10 keV) | 4000 | 1200 | 0 | amount of oxygen contained in the sealed vessel in these examples of the applications and variant examples is introduced in the proportions shown in Table 4. Despite the amount of oxygen the sealed vessel contains, the sealed vessel is adjusted so that it has an atmospheric pressure. Likewise, the amount of energy incident to the substrate surface in the radiation process is set at about 500 (mJ/cm$^2$), for example.

The results are shown in Table 4. The generation of a fence 12 around the via hole in examples of applications 12–13 and in variant examples 3–4 is inhibited. However, in order to maintain the incident energy volume toward the surface of the substrate at about 500 (mJ/cm$^2$), the required irradiation time increases precipitously with increases in the concentration of oxygen in the sealed vessel. This is from the oxygen absorbing at the about 157 nm wavelength. Also, the residual amount of the second photoresist 9 remaining after radiation treatment decreases the more that the oxygen concentration increases. When the residual amount of the second photoresist 9 decreases, the processing precision of the slot for the second wiring layer decreases. It is believed that the cause for this phenomenon is related to the ozone generated in the radiation processing. When the oxygen contained in the atmosphere absorbs light of a wavelength of about 180 nm or less it is easily changed into ozone. Because ozone chemically etches organic polymer films such as photoresists, the thickness of the second photoresist will decrease during the radiation processing if the ozone concentration is relatively high.

The above results demonstrate that it is possible to perform radiation processing for a short period of time by setting the oxygen concentration in the sealed vessel to about 4×10$^{-6}$ mol/L for example, and that the reduction of thickness of the second photoresist due to radiation processing will decrease. Also, since there is an inversely proportional relationship between transmittance and the distance of the sample from the light source, the transmittance of the radiation declines as the sample becomes more distinct. Thus it is appropriate to construct a process so that the product of the concentration of oxygen in the sealed vessel and the distance of the light source is kept below a set value. Since the distance between the light source and the specimen is about 0.25 m in this embodiment, it is desirable that the product of oxygen concentration e (mol/L) in the sealed vessel and the distance between the light source and the specimen be set as about 1×10$^{-6}$ (mol×m/L) or less, for example.

An approximately 157 nm wavelength is used for the radiation processing in this embodiment. However, as long as the light source has a wavelength of about 180 nm or less, any wavelength will be adequate.

TABLE 4

| | Oxygen concentration (mol/L) in chamber | Time (seconds) excimer laser irradiated on substrate at 500 (mJ/cm$^2$) energy | Film thickness (nm) of second photoresist 9 after radiation process | Height a (nm) of fence 12 | Residual amount d (nm) of SiN film after etching of slot for second wiring layer |
|---|---|---|---|---|---|
| Variant Example 3 | 2 × 10$^{-7}$ | 20 | 470 | 0 | 40 |
| Variant Example 4 | 8 × 10$^{-7}$ | 21 | 450 | 0 | 40 |
| Variant Example 5 | 4 × 10$^{-6}$ | 30 | 410 | 0 | 25 |
| Example of application 12 | 1.6 × 10$^{-5}$ | 113 | 300 | 0 | 8 |
| Example of application 13 | 4 × 10$^{-5}$ | 1600 | 230 | 0 | 0 |

TABLE 4-continued

In the following, variant examples 6–7 of a fifth embodiment of the invention will be explained in comparison with examples 14–16 with reference to FIG. 5 and FIG. 6.

FIG. 5 and FIG. 6 are drawings for explaining examples of applications 14–16 and variant examples 6–7. The examples of applications 14–16 of the second embodiment, and variants 6–7 of the method of manufacturing semiconductors are the same as the first example of application of the first embodiment. However, poly-α-methylstyrene is used as polymer film 11 in examples of application 14–16 and variant examples 6–7, and the light source used in the radiation processing is an excimer lamp radiating device made by Ushio Inc., for example, which can emit monochromatic light of about 222 nm. The light emitted from the irradiating device is converted into parallel rays using a lens and is caused to be incident with respect to the perpendicular direction of the substrate face at an angle θ. In addition, during the radiation processing, the substrate is rotated with the perpendicular to the substrate as the central axis. Likewise, the amount of incident energy in the radiation processing is set at about 500 (mJ/cm$^2$), for example. The process is performed so that the pattern width H', of the second photoresist 9 is about 200 nm, the depth D of the wiring slot is about 400 nm, the thickness D' of resist pattern is about 400 nm and the diameter H of the connection hole in the bottom of slot for wiring is about 170 nm.

The relationship controlling the angle of incidence θ of the radiation is set forth in equation (1):

$$\tan\theta \geq H + H'/2(D+D') \qquad \text{Equation (1)}$$

where H is the diameter of the connecting hole in the opening of the wiring slot, H' is the width of the wiring slot, D is the depth of the wiring slot and D' is the thickness of the film of the photoresist pattern.

The results are shown in Table 5. By evaluating the residual amount "d" of silicon nitride film 3 after ashing and removal of second photoresist 9 and polymer film 11, we observed that decreases do not occur in silicon nitride film 3 when θ is incident at an angle that fulfills equation 1. However, decreases do occur in silicon nitride film 3 when θ is incident at an angle that does not fulfill equation 1. This is due to the fact that when radiation is incident at a small angle so that θ does not fulfill equation 1, the resist deposited in the bottom of the via hole is damaged by the radiation and therefore can bear less etching.

From the above results, when radiation radiates at an angle of incidence that fulfills equation 1 in the radiation process, there will be no damage to the polymer film deposited in the bottom of the via hole and the etching rate of the polymer film adhering to the sides of the via hole will increase.

TABLE 5

|  | Radiation incidence angle θ (degrees) | Height of fence a [nm] | Amount of SiN film remaining d [nm] |
|---|---|---|---|
| Example of application 14 | 0 | 0 | 2 |
| Example of application 15 | 5 | 0 | 15 |
| Example of application 16 | 10 | 0 | 30 |
| Variant example 6 | 14 | 0 | 40 |
| Variant example 7 | 25 | 0 | 40 |

One aspect of the invention therefore renders it possible to increase the etching rate of the polymer film 11 adhering to the side walls of via holes, and one can restrict the etching residue that occurs in a fence configuration around via holes after the etching process of a slot for a second wiring layer.

Another aspect of the invention makes it possible to minimize damage to the silicon nitride film 3, which occurs in the etching process of the second wiring layer, by setting the thickness of polymer film 11 which is deposited in the bottom of via holes to 6 or more times the thickness of the polymer film adhering to the side walls of via holes.

With yet another aspect of the invention, one can selectively accelerate the degradation reaction of polymer chains, even for polymers which by nature tend to have a cross-linking reaction, by using wavelengths of about 180 nm or less in the irradiation processing.

With still another aspect of the invention, one can shorten the time necessary for the radiation processing of polymers 11, and in addition can prevent the degradation of second photoresist 9's anti-etching properties.

Further, an additional aspect of the invention permits an increase only in the etching rate of the polymer layer adhering on the side walls of via holes while maintaining the etching rate of polymer layer deposited on the bottom of the via holes.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

I claim:

1. A method for manufacturing a semiconductor which comprises:
   providing a layer insulation film over a substrate;
   depositing a first silicon nitride film over the layer insulation film;
   depositing a first silicon oxide film over the first silicon nitride film;
   depositing a second silicon nitride film over the first silicon oxide film;
   depositing a second silicon oxide film over the second silicon nitride film;
   etching a via hole to the surface of the first silicon nitride film;
   applying a polymer film over the second silicon dioxide film and the via hole;
   applying a mask over the polymer film;
   irradiating the polymer film;
   and immediately thereafter dry etching said irradiated polymer film; and
   removing the polymer film.

2. The method according to claim 1, wherein the polymer film comprises at least one photodegradable polymer selected from the group consisting of polymethylmethacrylate, polyisobutylene, poly-α-methylstyrene, polyacrylate, polymethacrylate, polymethacrylamide, polyvinylidene chloride, cellulose, cellulosic polymers, polytetrafluoroethylene, tetrafluoroethylene and vinylidene type monomer polymers and copolymers shown in Formula (1)

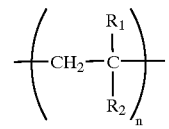

$$\left(\!-CH_2-\overset{\overset{\displaystyle R_1}{|}}{\underset{\underset{\displaystyle R_2}{|}}{C}}-\!\right)_n \tag{1}$$

wherein $R_1$ and $R_2$ in Formula (1) are each independently an alkyl group.

3. The method according to claim 1, wherein a thickness of the polymer film deposited in a bottom of the via hole is at least 6 times the thickness of the polymer film adhering to walls of the via hole.

4. The method according to claim 1, wherein a light source with a wavelength area of 180 nm or less is used to irradiate the polymer film in the irradiation step.

5. The method according to claim 4, wherein the light source is an electron beam, an ArF laser, an F2 excimer laser or a soft x-ray.

6. The method according to claim 1, wherein a concentration of oxygen e (mol/l) in a processing atmosphere during said irradiation is such that the product of e and f is about 1×10⁻⁶ (mol·m/l) or less, wherein a distance between a processing substrate and a light source is f (m).

7. The method according to claim 1, wherein an incidence angle θ of radiation rays in the irradiating step with respect to a perpendicular direction of a surface of the substrate, fulfills the relationship of equation (1):

$$\tan\theta \geq H + H'/2(D+D') \tag{1}$$

wherein D is a depth of a wiring slot, D' is a thickness of the film of a photoresist, H is a diameter of the via hole in a opening of the wiring slot, and H' is the width of the wiring slot.

8. The method according to claim 1, wherein the etching is performed using $C_4F_8$:$O_2$:Ar gas at a proportion of 30:20:5.

9. The method according to claim 1, wherein no fence is generated.

10. The method according to claim 1, wherein the etching the via hole step is performed by
   applying a first photoresist layer;
   anisotropic etching; and
   removing the first photoresist layer.

11. The method according to claim 10, wherein removing the first photoresist layer is performed by oxygen ashing.

12. The method according to claim 10, wherein the first photoresist layer has a thickness of about 500 nm.

13. The method according to claim 1, wherein the applying the mask step comprises forming a second photoresist layer over the polymer film, the second photoresist layer having an opening corresponding to a portion of a wiring slot.

14. The method according to claim 13, wherein the removing the polymer film step is performed by ashing using oxygen gas, whereby the second photoresist layer is also removed.

15. The method according to claim 1, wherein the irradiation is performed using energy of about 200 (mJ/cm$^2$).

16. The method according to claim 1, wherein the first silicon nitride film has a thickness of about 40 nm, the fist silicon oxide film has a thickness of about 400 nm, the second silicon nitride film has a thickness of about 50 nm and the second silicon oxide film has a thickness of about 500 nm.

17. The method according to claim 7, wherein H is about 170 nm, H' is about 200 nm, D is about 400 nm and D' is about 400 nm.

* * * * *